(12) United States Patent
Lee et al.

(10) Patent No.: US 10,050,204 B2
(45) Date of Patent: Aug. 14, 2018

(54) ENCAPSULATION COMPOSITION (AS AMENDED)

(71) Applicant: LG CHEM, LTD., Seoul (KR)

(72) Inventors: Seung Min Lee, Daejeon (KR); Suk Ky Chang, Daejeon (KR); Min Soo Park, Daejeon (KR); Hyun Jee Yoo, Daejeon (KR); Jung Sup Shim, Daejeon (KR); Yoon Gyung Cho, Daejeon (KR); Kyung Yul Bae, Daejeon (KR); Hyun Suk Kim, Daejeon (KR); Jung Ok Moon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/762,399

(22) PCT Filed: Jul. 21, 2014

(86) PCT No.: PCT/KR2014/006605
§ 371 (c)(1),
(2) Date: Jul. 21, 2015

(87) PCT Pub. No.: WO2015/009129
PCT Pub. Date: Jan. 22, 2015

(65) Prior Publication Data
US 2015/0357570 A1 Dec. 10, 2015

(30) Foreign Application Priority Data

Jul. 19, 2013 (KR) ........................ 10-2013-0085591
Jul. 19, 2013 (KR) ........................ 10-2013-0085663

(51) Int. Cl.
| | |
|---|---|
| C08L 23/22 | (2006.01) |
| H01L 51/00 | (2006.01) |
| H01L 51/52 | (2006.01) |
| H01L 51/56 | (2006.01) |
| C09J 133/06 | (2006.01) |
| C09J 123/22 | (2006.01) |
| C08L 101/00 | (2006.01) |
| C08F 220/18 | (2006.01) |

(52) U.S. Cl.
CPC .......... *H01L 51/004* (2013.01); *C08L 23/22* (2013.01); *C08L 101/005* (2013.01); *C09J 123/22* (2013.01); *C09J 133/06* (2013.01); *H01L 51/5237* (2013.01); *H01L 51/56* (2013.01); *C08F 220/18* (2013.01); *C08L 2203/16* (2013.01); *C08L 2203/206* (2013.01); *C08L 2205/04* (2013.01); *C08L 2312/00* (2013.01); *H01L 51/5246* (2013.01)

(58) Field of Classification Search
CPC ........ C08L 101/00; C08L 23/22; C08L 33/04; C08L 2203/16; C08L 2203/206; C08L 2205/04; C08L 2312/00; C09J 133/06; H01L 51/004; H01L 51/5237; H01L 51/56; H01L 51/5246
See application file for complete search history.

(56) References Cited

U.S. PATENT DOCUMENTS

| | | | | |
|---|---|---|---|---|
| 5,068,490 A * | 11/1991 | Eaton | ..................... | C08F 10/00 423/293 |
| 5,763,529 A * | 6/1998 | Lucas | ................... | C08F 283/00 524/197 |
| 2009/0291291 A1 * | 11/2009 | Epple | ..................... | C09J 7/0246 428/317.3 |
| 2010/0170636 A1 | 7/2010 | Hanefeld et al. | | |
| 2010/0295091 A1 * | 11/2010 | Strzegowski | ......... | H01L 31/048 257/100 |
| 2011/0105637 A1 * | 5/2011 | Fujita | ..................... | C08L 23/22 522/120 |
| 2011/0230621 A1 * | 9/2011 | Hildebrandt | .......... | C08F 255/08 525/216 |

(Continued)

FOREIGN PATENT DOCUMENTS

| | | |
|---|---|---|
| CN | 102245656 A | 11/2011 |
| CN | 102695731 A | 9/2012 |

(Continued)

OTHER PUBLICATIONS

Polyisobutylene properties downloaded Sep. 16, 2016 from http://polymerprocessing.com/polymers/PIB.html.*

(Continued)

*Primary Examiner* — Irina S Zemel
*Assistant Examiner* — Jeffrey S Lenihan
(74) *Attorney, Agent, or Firm* — Dentons US LLP

(57) ABSTRACT

An encapsulation composition, an encapsulation film including the same, an encapsulation product for organic electronic devices, and a method of manufacturing an organic electronic device are provided. The encapsulation composition can be useful in effectively preventing moisture or oxygen from flowing into the organic electronic device from external environments while realizing transparency when the organic electronic device is encapsulated by the encapsulation composition. Also, the encapsulation film formed of the encapsulation composition can be useful in ensuring mechanical properties such as handling properties and processability, and the organic electronic device whose encapsulation structure is formed by means of the encapsulation film may have improved lifespan and durability, thereby providing an encapsulation product for organic electronic devices showing high reliability.

11 Claims, 1 Drawing Sheet

(56) References Cited

U.S. PATENT DOCUMENTS

2012/0274881 A1* 11/2012 Jang ................. C09J 133/02
349/96
2014/0319497 A1 10/2014 Cho et al.

FOREIGN PATENT DOCUMENTS

| | | |
|---|---|---|
| EP | 2502962 B1 | 3/2015 |
| EP | 3012284 A1 | 4/2016 |
| JP | 2008-248055 A | 10/2008 |
| JP | 2011-513502 A | 4/2011 |
| JP | 2012126896 A | 7/2012 |
| KR | 1020080088606 A | 10/2008 |
| KR | 1020120105557 A | 9/2012 |
| KR | 1020130055541 A | 5/2013 |
| KR | 1020130055544 A | 5/2013 |
| KR | 1020130081261 A | 7/2013 |
| WO | 2009/148722 A2 | 12/2009 |
| WO | 2011/062851 A1 | 5/2011 |
| WO | 2011/062852 A1 | 5/2011 |
| WO | WO-2011065779 A2 * | 6/2011 |
| WO | 2013-073902 A1 | 5/2013 |
| WO | WO-2013165637 A1 * | 11/2013 |

OTHER PUBLICATIONS

Polymer Contact angles downloaded Sep. 16, 2016 from https://www.accudynetest.com/polytable_03.html?sortby=contact_angle.*
Glass transition temperature of polymers downloaded from https://www.sigmaaldrich.com/content/dam/sigma-aldrich/docs/Aldrich/General_Information/thermal_transitions_of_homopolymers.pdf on Sep. 13, 2017.*

* cited by examiner

ENCAPSULATION COMPOSITION (AS AMENDED)

This application is a National Stage Application of International Application No. PCT/KR2014/006605, filed Jul. 21, 2014, and claims the benefit of Korean Application No. 10-2013-0085591, filed Jul. 19, 2013 and Korean Application No. 10-2013-0085663, filed Jul. 19, 2013, all of which are hereby incorporated by reference in their entirety for all purposes as if fully set forth herein.

BACKGROUND

1. Field of the Invention

The present application relates to an encapsulation composition, an encapsulation film including the same, an encapsulation product for organic electronic devices, and a method of manufacturing an organic electronic device.

2. Discussion of Related Art

An organic electronic device (OED) means a device including an organic material layer in which charge transfer occurs using holes and electrons. By way of example, the organic electronic device may include a photovoltaic device, a rectifier, a transmitter, and an organic light emitting diode (OLED).

Among the organic electronic devices, OLEDs have low power consumption, rapid response time, and can be easily made into a thin display device or lighting, compared to conventional light sources. Also, OLEDs have excellent space utilization, and thus are expected to be applicable in various fields including all kinds of portable devices, monitors, notebook computers and TVs.

Durability is the most major problem in commercializing OLEDs and expanding their applications. Organic materials and metal electrodes included in the OLEDs are very easily oxidized by external factors such as moisture. Therefore, products including the OLEDs are highly sensitive to environmental factors. Thus, various methods to effectively prevent penetration of oxygen or moisture into the organic electronic devices such as OLEDs from external environments have been proposed.

Korean Unexamined Patent Application Publication No. 2008-0088606 discloses an adhesive encapsulation composition film and an organic electroluminescence device. Here, the adhesive is a polyisobutylene (PIB)-based pressure-sensitive adhesive which has poor processability, and poor reliability at high-temperature and high-humidity conditions.

Therefore, development of encapsulants which is able to maintain reliability at high-temperature and high-humidity conditions while ensuring the desired lifespan and effectively preventing penetration of moisture in the organic electronic device and has excellent optical properties is required.

SUMMARY OF THE INVENTION

The present application is directed to providing an encapsulation composition, an encapsulation film including the same, an encapsulation product for organic electronic devices, and a method of manufacturing an organic electronic device. More particularly, the present application is directed to providing an encapsulation composition capable of maintaining reliability at high-temperature and high-humidity conditions while ensuring the desired lifespan and effectively preventing penetration of moisture in an organic electronic device and having excellent optical properties, and an encapsulation film including the same.

Hereinafter, exemplary embodiments of the present application will be described in further detail with reference to the accompanying drawings. In describing the present application, detailed description of general functions or configurations known in the related art are also omitted for clarity. Further the accompanying drawings are schematically shown to aid in understanding the present application, and thus description of parts irrelevant to the description are omitted in order to describe the present application more clearly. In the drawings, the shapes and dimensions of elements may be exaggerated in order to describe several layers and regions more clearly, and the thicknesses, sizes, ratios and the like shown in the drawings are not intended to limit the scope of the present application.

One aspect of the present application provides an encapsulation composition. According to one exemplary embodiment of the present application, the encapsulation composition may include a first resin having a water vapor transmission rate (WVTR) of 50 $g/m^2 \cdot day$ or less, and a second resin containing a reactive functional group. Also, the second resin may form a semi-interpenetrating polymer network (semi-IPN) with the first resin. The WVTR may be a WVTR measured by preparing the first resin in the form of a film having a thickness of 100 µm and measuring a WVTR of the film in a transverse direction at 100° F. and 100% relative humidity.

For example, the encapsulation composition may be applied to encapsulation of organic electronic devices such as OLEDs. According to one exemplary embodiment, the encapsulation composition may be formed into an encapsulation layer having a single-layer or multilayer structure, which may be used to encapsulate the organic electronic device. When the encapsulation layer is formed to have a multilayer structure, an encapsulation film may include at least one encapsulation layer including the above-described encapsulation composition, and may further include a pressure-sensitive adhesive layer, or an adhesive layer. Materials capable of forming the pressure-sensitive adhesive layer or the adhesive layer further included in the encapsulation film are not particularly limited, and may include or may not include a moisture absorbent.

In this specification, the term "encapsulation layer" refers to an adhesive layer, a pressure-sensitive adhesive layer, or a pressure-sensitive adhesive/adhesive layer formed from the encapsulation composition. Therefore, the encapsulation composition may refer to a component capable of forming the encapsulation layer. The pressure-sensitive adhesive/adhesive layer refers to an adhesive layer which is maintained in a solid or semi-solid phase at room temperature, can attach an adherend without formation of bubbles when exposed to heat, and can firmly fix a target subject by means of an adhesive after consolidation.

In this specification, the term "organic electronic device" refers to a product or device having a structure including an organic material layer in which charge transfer occurs between a pair of facing electrodes using holes and electrons. Examples of the organic electronic device may include a photovoltaic device, a rectifier, a transmitter, and an organic light emitting diode (OLED), but the present application is not limited thereto. According to one exemplary embodiment of the present application, the organic electronic device may be an OLED.

According to one exemplary embodiment, as described above, the first resin having a WVTR of 50 $g/m^2 \cdot day$ or less and the second resin containing a reactive functional group included in the encapsulation composition may form a semi-interpenetrating polymer network (hereinafter referred to as "semi-IPN"). In this specification, the term "semi-IPN" has at least one polymer cross-linked structure (i.e., a polymer network) and includes at least one linear or branched polymer. Here, the semi-IPN has a structure in which at least a portion of the linear or branched polymer is interpenetrated into the polymer cross-linked structure. The semi-IPN differentiates from an IPN structure in that the linear or branched polymer can be theoretically separated from the polymer cross-linked structure without any loss of chemical bonds. According to one exemplary embodiment, the second resin containing a reactive functional group may form a cross-linked structure, and the first resin may penetrate into the cross-linked structure of the second resin to form a semi-IPN.

According to one exemplary embodiment, the cross-linked structure may be a cross-linked structure formed by application of heat, a cross-linked structure formed by irradiation with active energy rays, or a cross-linked structure formed by aging at room temperature. As such, a category of the term "active energy rays" may include particle beams such as alpha-particle beams, proton beams, neutron beams or electron beams, as well as microwaves, infrared rays (IR), ultraviolet rays (UV), X rays and gamma rays. In general, the UV rays or electron beams may be used herein. By introducing such a semi-IPN structure, it is possible to enhance mechanical properties such as processability of the encapsulation composition, improve moisture-resistant adhesive properties, and realize transparency, thereby exhibiting high moisture barrier properties and excellent panel lifespan which have not been achieved so far.

According to one exemplary embodiment of the present application, the encapsulation composition may include the first resin having a WVTR of 50 g/m$^2$·day or less, 45 g/m$^2$·day or less, 40 g/m$^2$·day or less, 35 g/m$^2$·day or less, or 30 g/m$^2$·day or less, as described above. The WVTR may be a WVTR measured by preparing the first resin in the form of a film having a thickness of 100 μm and measuring a WVTR of the film in a transverse direction at 100° F. and 100% relative humidity. The encapsulation composition according to one exemplary embodiment of the present application may be used to form a film having excellent moisture barrier properties by controlling the WVTR of the film formed from the encapsulation composition including the first resin. As the WVTR of the first resin decreases, the film may exhibit superior moisture barrier properties. Thus, the lower limit of the WVTR is not particularly limited. For example, the lower limit of the WVTR of the encapsulation layer may be 0 g/m$^2$·day, or 1 g/m$^2$·day.

According to one exemplary embodiment, the first resin may have a contact angle of 80° or more, 85° or more, 90° or more, or 95° or more with deionized water. The contact angle is a contact angle measured by coating a glass with a solution having a solid content of approximately 15% by weight, which is prepared by dissolving the first resin in a proper solvent, drying the solution to form a coating film and dropping deionized water onto the coating film at approximately 25° C. In this case, the contact angle may be an average value of the contact angles measured by repeatedly performing this procedure 10 times. The details regarding the measurement of the contact angle will make reference to Examples. Films having excellent moisture barrier properties and durability may be provided by controlling the contact angle of resins capable of forming the encapsulation composition as described above. The upper limit of the contact angle of the component is not particularly limited, and may, for example, be less than or equal to 150°, or 120°.

As the first resin satisfies the above-described ranges of contact angle and WVTR, the film having excellent moisture barrier properties, water repellency and the like may be formed. Resins known in the related art may be used without limitation as the first resin forming the encapsulation composition as long as they can satisfy the above-described contact angle or WVTR. Also, although the respective resins do not satisfy the contact angle and WVTR, when combinations of the resins satisfy the contact angle and WVTR, such resins may be used to form the encapsulation composition.

In the encapsulation composition according to one exemplary embodiment, the first resin may have a glass transition temperature of 0° C. or less, less than 5° C., less than −10° C., less than −30° C., less than −50° C., or less than −60° C. As such, the glass transition temperature may refer to a glass transition temperature after irradiation with UV rays at a dose of approximately 1 J/cm$^2$ or more, a glass transition temperature after irradiation with UV rays, followed by further performing a thermal curing process.

Known materials may be used without limitation as the first resin as long as they satisfy the above-described contact angle or WVTR. For example, the first resin may include a styrene resin, a polyolefin resin, a thermoplastic elastomer, a polyoxyalkylene resin, a polyester resin, a vinyl chloride resin, a polycarbonate resin, a polyphenylene sulfide resin, a polyamide resin, an acrylate resin, an epoxy resin, a silicone resin, a fluoride resin, or a mixture thereof.

As such, examples of the styrene-based resin may, for example, include a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer, or a mixture thereof.

Examples of the olefin-based resin may, for example, include a high-density polyethylene-based resin, a low-density polyethylene-based resin, a polypropylene-based resin, or a mixture thereof.

For example, an ester-based thermoplastic elastomer, an olefin-based thermoplastic elastomer, or a mixture thereof may be used as the thermoplastic elastomer. Among theses, a polybutadiene resin or a polyisobutylene resin may be used as the olefin-based thermoplastic elastomer.

Examples of the polyoxyalkylene-based resin may, for example, include a polyoxymethylene-based resin, a polyoxyethylene-based resin, or a mixture thereof. Examples of the polyester-based resin may, for example, include a polyethylene terephthalate-based resin, a polybutylene terephthalate-based resin, or a mixture thereof. Examples of the vinyl chloride-based resin may, for example, include a polyvinylidene chloride. Examples of the mixture of hydrocarbons may, for example, include a hexatriacotane, or paraffin.

Examples of the polyamide-based resin may, for example, include nylon, and like. Examples of the acrylate-based resin may, for example, include polybutyl(meth)acrylate n, and like. Examples of the epoxy-based resin may, for example, include a bisphenol-type resin such as a bisphenol A-type resin, a bisphenol F-type resin, a bisphenol S-type resin and a hydrate thereof; a novolac-type resin such as a phenol novolac-type resin or a cresol novolac-type resin; a nitrogen-containing ring-type resin such as a triglycidylisocyanurate-type resin or a hydantoin-type resin; an alicyclic resin; an aliphatic resin; an aromatic resin such as a naphthalene-type resin or a biphenyl-type resin; a glycidyl-type resin such as a glycidyl ether-type resin, glycidyl amine-type resin or a glycidyl ester-type resin; a dicyclo-type resin such as a dicyclopentadiene-type resin; an ester-type resin; an ether ester-type resin, or a mixture thereof.

Examples of the silicone-based resin may, for example, include polydimethylsiloxane, and the like. Also, examples of the fluoride-based resin may, for example, include a polytrifluoroethylene resin, a polytetrafluoroethylene resin, a polychlorotrifluoroethylene resin, a polyhexafluoropropylene resin, polyvinylidene fluoride, polyvinylidene fluoride, polyethylene propylene fluoride, or a mixture thereof.

The above-listed resins may, for example, be used when engrafted with a maleic anhydride and the like, and also be used when copolymerized with the above-described other resins and monomers for preparing a resin. In addition, the resins may also be used when modified with other compounds. Examples of the other compound may include a carboxyl-terminal butadiene-acrylonitrile copolymer, and the like.

According to one exemplary embodiment, the first resin may include a polyisobutylene resin. The polyisobutylene resin may exhibit low hydrophobicity, and thus may have low WVTR and surface energy. According to one exemplary embodiment of the present application, the first resin may also be a copolymer of a diene and an olefin-based compound containing one carbon-carbon double bond. Here, the olefin-based compound may include isobutylene, propylene, or ethylene, and the diene may be a monomer polymerizable with the olefin-based compound. For example, the diene may include 1-butene, 2-butene, isoprene, or butadiene. That is, a homopolymer of an isobutylene monomer; a copolymer obtained by copolymerizing another monomer polymerizable with the isobutylene monomer; or a mixture thereof may, for example, be used as the first resin according to one exemplary embodiment of the present application. According to one exemplary embodiment, the copolymer of the diene and the olefin-based compound containing one carbon-carbon double bond may be a butyl rubber. Conventional polyisobutylene polymers have low WVTR, but exhibit poor processability, moisture resistance, adhesiveness, and heat resistance. Therefore, according to one exemplary embodiment of the present application, moisture resistance and heat resistance of the polyisobutylene polymer may be improved by introducing various cross-linked structures so as to compensate for the poor physical properties.

A base resin having a weight average molecular weight (Mw) such that the base resin can be molded in the form of a film may be used as the first resin. According to one exemplary embodiment, the weight average molecular weight of the base resin which may be molded in the form of a film may be in a range of approximately 30,000 to 2,000,000, 100,000 to 1,500,000, or 500,000 to 1,000,000. In this specification, the term "weight average molecular weight" refers to a value converted with respect to a polystyrene standard as measured by gel permeation chromatography (GPC).

Also, the above-described resins may be used alone or in combination of two or more as the first resin of the encapsulation composition. When the resins are used in combination of two or more, two or more different types of resins may be used, two or more resins having different weight average molecular weights may be used, or two or more different types of resins having different weight average molecular weights may be used.

The encapsulation composition according to one exemplary embodiment of the present application may include a second resin having a cross-linked structure so as to form the above-described semi-IPN.

The second resin may, for example, be included at a content of 1 to 50 parts by weight, 3 to 50 parts by weight, 5 to 50 parts by weight, 5 to 50 parts by weight, 5 to 40 parts by weight, 7 to 35 parts by weight, 10 to 30 parts by weight, or 10 to 25 parts by weight, with respect to 100 parts by weight of the first resin.

According to one exemplary embodiment, a difference in solubility parameter between the first resin and the second resin may be 1 $(cal/cm^3)^{1/2}$ or less. In this case, the first resin and second resin may effectively form a semi-IPN since compatibility of the first resin with the second resin is ensured. As the difference in solubility parameter decreases, excellent compatibility may be expressed. Thus, the lower limit of the difference in solubility parameter is particularly limited. For example, the lower limit of the difference in solubility parameter may be 0 $(cal/cm^3)^{1/2}$, or 0.01 $(cal/cm^3)^{1/2}$.

According to one exemplary embodiment, the second resin may have a glass transition temperature of −40° C. or more, −30° C. or more, −20° C. or more, −10° C. or more, 0° C. or more, 10° C. or more, 20° C. or more, 30° C. or more, 40° C. or more, or 50° C. or more. Resins having such a glass transition temperature may be used to make up for the poor mechanical properties of the first resin.

According to some exemplary embodiments, the second resin may include a polymer. According to one exemplary embodiment, the cross-linked structure of the second resin may be realized by allowing an acrylic polymer and a cross-linking agent to react with each other by application of heat, or may be realized by polymerizing a multifunctional acrylate by irradiation with light.

According to one exemplary embodiment, the polymer is a polymer of a mixture including at least one alkyl(meth)acrylate and a monomer containing at least one reactive functional group providing functional groups along the backbone of the polymer. According to one exemplary embodiment, the alkyl(meth)acrylate may satisfy the following Formula 1.

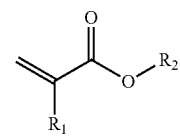

[Formula 1]

In Formula 1, $R_1$ represents hydrogen, or an alkyl group having 1 to 4 carbon atoms, 1 to 3 carbon atoms, or 1 to 2 carbon atoms. Also, $R_2$ represents a linear or branched alkyl group having 3 to 30 carbon atoms, 4 to 28 carbon atoms, 5 to 26 carbon atoms, 6 to 24 carbon atoms, 7 to 22 carbon atoms, 8 to 20 carbon atoms, 9 to 20 carbon atoms, or 10 to 20 carbon atoms. The second resin may easily form a cross-linked structure to effectively realize a semi-IPN with the first resin by controlling the carbon atoms as described above. According to one exemplary embodiment, $R_2$ may also represent a cyclic alkyl group having 3 to 30 carbon atoms, 4 to 28 carbon atoms, 5 to 26 carbon atoms, 6 to 24 carbon atoms, 6 to 22 carbon atoms, or 6 to 20 carbon atoms. As such, the second resin may easily form a cross-linked structure to effectively realize a semi-IPN with the first resin by controlling the carbon atoms of the alkyl(meth)acrylate in the second resin using a cyclic alkyl group having certain carbon atoms.

According to some exemplary embodiments, the alkyl (meth)acrylate may include cyclohexyl(meth)acrylate, 2-octyl acrylate, isobornyl acrylate, butyl(meth)acrylate, t-butyl (meth)acrylate, pentyl(meth)acrylate, 2-ethylhexyl(meth) acrylate, n-octyl(meth)acrylate, isooctyl(meth)acrylate, isononyl(meth)acrylate, lauryl(meth)acrylate, tetra decyl (meth)acrylate, or a combination thereof.

Unless particularly defined otherwise this specification, the term "alkyl group" may refer to an alkyl group having 1 to 30 carbon atoms, 1 to 25 carbon atoms, 1 to 20 carbon atoms, 1 to 16 carbon atoms, 1 to 12 carbon atoms, 1 to 8 carbon atoms, or 1 to 4 carbon atoms. The alkyl group may have a linear, branched or cyclic structure, and may be optionally substituted with one or more substituents.

Also, the polymer may include a monomer having a reactive functional group as a copolymerization unit. The monomer having a reactive functional group may be a copolymerization unit derived from a copolymerizable monomer containing a hydroxyl group, a carboxyl group, an epoxy group-containing monomer, or a nitrogen-containing functional group.

As such, a monomer which may provide a hydroxyl group to the polymer after polymerization since the monomer includes both the hydroxyl group and a moiety copolymerizable with other monomers capable of forming the polymer may be used as the copolymerizable monomer containing a hydroxyl group. Such a monomer may include a hydroxyalkyl(meth)acrylate such as 2-hydroxyethyl(meth)acrylate, 2-hydroxypropyl(meth)acrylate, 4-hydroxybutyl(meth)acrylate, 6-hydroxyhexyl (meth)acrylate, or 8-hydroxyoctyl (meth)acrylate, or a hydroxyalkylene glycol(meth)acrylate such as 2-hydroxyethylene glycol (meth)acrylate, or 2-hydroxypropylene glycol (meth)acrylate, but the present application is not limited thereto.

For example, a carboxyl group-containing compound or an anhydride thereof, such as (meth)acrylic acid, 2-(meth) acryloyloxy acetic acid, 3-(meth)acryloyloxy propylic acid, 4-(meth)acryloyloxy butylic acid, an acrylic acid dimer, itaconic acid, maleic acid, or a maleic anhydride may be used as the copolymerizable monomer containing a carboxyl group, but the present application is not limited thereto.

For example, (meth)acrylonitrile, (meth)acrylamide, N-methyl(meth)acrylamide, N-methylol (meth)acrylamide, N-vinyl pyrrolidone, and N-vinyl caprolactam may be used as the nitrogen-containing copolymerizable monomer, but the present application is not limited thereto.

In the polymer, the monomer containing a reactive functional group may be included at a content of 0.5 to 50 parts by weight, 0.5 to 40 parts by weight, 1 to 30 parts by weight, 2 to 20 parts by weight, 3 to 15 parts by weight, or 5 to 10 parts by weight, with respect to 100 parts by weight of the alkyl(meth)acrylate, but the present application is not limited thereto. A proper cross-linked structure may be realized by controlling the content of the monomer as described above.

The encapsulation composition may further include a multifunctional cross-linking agent. For example, the cross-linking agent may react with the polymer by application of heat to realize a cross-linked structure.

For example, cross-linking agents such as an isocyanate cross-linking agent, an epoxy cross-linking agent, an aziridine cross-linking agent, and a metal chelate cross-linking agent may be used as the multifunctional cross-linking agent, but the present application is not limited thereto.

Examples of the isocyanate cross-linking agent may include a multifunctional isocyanate compound such as tolylene diisocyanate, xylene diisocyanate, diphenylmethane diisocyanate, hexamethylene diisocyanate, isophorone diisocyanate, tetramethylxylene diisocyanate, or naphthalene diisocyanate, or a compound obtained by allowing the multifunctional isocyanate compound to react with a polyol compound such as trimethylol propane.

Examples of the epoxy cross-linking agent may include at least one selected from the group consisting of ethylene glycol diglycidyl ether, triglycidyl ether, trimethylolpropane triglycidyl ether, N,N,N',N'-tetraglycidyl ethylenediamine, and glycerine diglycidyl ether. Examples of the aziridine cross-linking agent may include may include at least one selected from the group consisting of N,N'-toluene-2,4-bis (1-aziridine carboxamide), N,N'-diphenylmethane-4,4'-bis (1-aziridine carboxamide), triethylene melamine, bisisophthaloyl-1-(2-methylaziridine), and tri-1-aziridinylphosphine oxide, but the present application is not limited thereto.

Also, examples of the metal chelate-based cross-linking agent ma includes a compound in which a polyvalent metal such as aluminum, iron, zinc, tin, titanium, antimony, magnesium and/or vanadium is coordinated with acetyl acetone or ethyl acetoacetate, but the present application is not limited thereto.

The multifunctional cross-linking agent may, for example, be included at a content of 0.01 parts by weight to 10 parts by weight, or 0.01 parts by weight to 5 parts by weight in the pressure-sensitive adhesive composition, with respect to 100 parts by weight of the polymer. Within this content range, cohesiveness or durability of the encapsulation composition may be maintained excellently.

According to another exemplary embodiment, the second resin may, for example, include a polymer of a multifunctional active energy ray-polymerizable compound which may be polymerized by irradiation with active energy rays. For example, the compound may refer to a compound at least two functional groups capable of taking part in a polymerization reaction by irradiation with active energy rays, for example, at least two functional groups selected from the group consisting of a functional group containing an ethylenic unsaturated double bond such as an acryloyl group, or a methacryloyl group; a functional group such as an epoxy group, or an oxetane group, and the like.

For example, a multifunctional acrylate (MFA) may be used as the multifunctional active energy ray-polymerizable compound.

Compounds containing at least two (meth)acryloyl groups in the molecule may be used as the multifunctional acrylate without limitation. For example, the multifunctional acrylate that may be used herein may include a difunctional acrylate such as 1,4-butanediol di(meth)acrylate, 1,6-hexanediol di(meth)acrylate, neopentylglycol di(meth)acrylate, polyethylene glycol di(meth)acrylate, neopentylglycol adipate di(meth)acrylate, hydroxyl puivalic acid neopentylglycol di(meth)acrylate, dicyclopentanyl di(meth)acrylate, caprolactone-modified dicyclopentenyl di(meth)acrylate, ethyleneoxide-modified di(meth)acrylate, di(meth)acryloxy ethyl isocyanurate, allylated cyclohexyl di(meth)acrylate, tricyclodecanedimethanol(meth)acrylate, dimethylol dicyclopentane di(meth)acrylate, ethyleneoxide-modified hexahydrophthalic acid di(meth)acrylate, tricyclodecane dimethanol(meth)acrylate, neopentylglycol-modified trimethylpropane di(meth)acrylate, adamantane di(meth)acrylate, or 9,9-bis[4-(2-acryloyloxyethoxy)phenyl]fluorine; a trifunctional acrylate such as trimethylolpropane tri(meth)

acrylate, dipentaerythritol tri(meth)acrylate, propionic acid-modified dipentaerythritol tri(meth)acrylate, pentaerythritol tri(meth)acrylate, propyleneoxide-modified trimethylolpropane tri(meth)acrylate, trifunctional urethane(meth)acrylate, or tris(meth)acryloxyethylisocyanurate; a tetrafunctional acrylate such as diglycerin tetra(meth)acrylate, or pentaerythritol tetra(meth)acrylate; a pentafunctional acrylate such as propionic acid-modified dipentaerythritol penta(meth)acrylate; and a hexafunctional acrylate such as dipentaerythritol hexa(meth)acrylate, caprolactone-modified dipentaerythritol hexa(meth)acrylate, or urethane (meth) acrylate (for example, a reaction product of an isocyanate monomer and trimethylolpropane tri(meth)acrylate, etc.). Optionally, various types of the multifunctional acrylate such as urethane acrylate, polycarbonate acrylate, polyester acrylate, polyether acrylate, or epoxy acrylate may also be used as those known as photocurable oligomers known in the related art.

A compound having a molecular weight of less than 1,000 and containing three or more functional groups may, for example, be used as the multifunctional active energy ray-polymerizable compound. In this case, the molecular weight may refer to a weight average molecular weight, or a typical molecular weight. Compounds having a ring structure in the backbone structure may be used as the multifunctional acrylate. In the present application, an effect of improving heat resistance and moisture resistance of the encapsulation composition may be enhanced through the ring structure. The ring structure included in the multifunctional acrylate may be one of a carbocyclic structure, or heterocyclic structure; or a monocyclic or polycyclic structure. Examples of the multifunctional acrylate having a ring structure may include a monomer having an isocyanurate structure, such as tris(meth)acryloxy ethyl isocyanurate, and a hexafunctional acrylate such as isocyanate-modified urethane (meth)acrylate (for example, a reaction product of an isocyanate monomer and trimethylolpropane tri(meth)acrylate, etc.), but the present application is not limited thereto.

The encapsulation composition may further include a radical initiator to induce a polymerization reaction of the active energy ray-polymerizable compound. The radical initiator may be a photoinitiator, or a thermal initiator. Specific types of the photoinitiator may be properly chosen in consideration of curing rate and yellowing probability. For example, a benzoin-based, hydroxy ketone-based, amino ketone-based or phosphine oxide-based photoinitiator may be used. More particularly, examples of the photoinitiator that may be used herein may include benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-amino anthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], and 2,4,6-trimethylbenzoyl-diphenyl-phosphine oxide.

The radical initiator may be included at a content of 0.2 parts by weight to 20 parts by weight, with respect to 100 parts by weight of the active energy ray-polymerizable compound. A reaction of the active energy ray-polymerizable compound may be effectively induced by means of the radical initiator, and degradation of physical properties of a pressure-sensitive adhesive may also be prevented due to the presence of residual components after curing.

The polymer may be prepared using known polymerization methods. For example, the polymer may be prepared by subjecting a monomer mixture, which is obtained by properly mixing an alkyl(meth)acrylate, a monomer containing an active functional group and/or another comonomer at desired weight ratios, to a conventional polymerization method such as solution polymerization, photo-polymerization, bulk polymerization, suspension polymerization, or emulsion polymerization. Optionally, a polymerization initiator, or a chain transfer agent may also be used together in a polymerization process.

According to one exemplary embodiment, the encapsulation composition may have a light transmittance of 80% or more, 81% or more, 82% or more, 83% or more, 84% or more, 85% or more, 86% or more, 87% or more, 88% or more, 89% or more, 90% or more, or 91% or more, as measured for light transmittance with respect to light having a wavelength of 380 nm to 780 nm using a spectrophotometer in a state in which the encapsulation composition is prepared in the form of a film. As described above, the encapsulation composition according to one exemplary embodiment of the present application may exhibit excellent light transmittance when prepared in the form of a film, and thus may be applied to top emission-type OLEDs to be described below, thereby realizing excellent optical properties.

According to one exemplary embodiment of the present application, the encapsulation composition may include a tackifier. For example, a hydrogenated petroleum resin obtained by hydrogenating a petroleum resin may be used as the tackifier. The hydrogenated petroleum resin may be partially or completely hydrogenated, and may be a mixture of such resins. Such a tackifier may be selected from tackifiers having excellent moisture barrier properties while exhibiting compatibility with the encapsulation composition. Specific types of the hydrogenated petroleum resin may include a hydrogenated terpene-based resin, a hydrogenated ester-based resin, or a hydrogenated dicyclopentadiene-based resin. The tackifier may have a weight average molecular weight of approximately 200 to 5,000. The content of the tackifier may be properly adjusted, as necessary. For example, the tackifier may be included at a content of 5 parts by weight to 100 parts by weight in the encapsulation layer, with respect to 100 parts by weight of the encapsulation composition.

According to one exemplary embodiment of the present application, the encapsulation composition may further include a moisture absorbent. The term "moisture absorbent" may be used as a meaning generally referring to components capable of absorbing or removing moisture or humidity introduced from external environments by means of a physical or chemical reaction, and the like. That is, the moisture absorbent refers to a moisture reactive absorbent, or a physical absorbent. In this case, a mixture of moisture absorbents may also be used herein. When the encapsulation composition according to one exemplary embodiment of the present application includes the moisture absorbent, the encapsulation composition may not satisfy the above-described light transmittance, but may rather exhibit excellent moisture barrier properties.

According to one exemplary embodiment, the moisture reactive absorbent reacts chemically with humidity, moisture or oxygen introduced into the encapsulation layer to absorb moisture or humidity. The physical absorbent may inhibit penetration of moisture or humidity by lengthening a moving path through moisture or humidity penetrated into the encapsulation structure flows, and may maximize barrier properties to moisture and humidity by means of a matrix structure of an encapsulation resin, and an interaction with the moisture reactive absorbent.

Specific types of the moisture absorbent that may be used herein are not particularly limited. For example, the moisture reactive absorbent may include a metal powder such as alumina, a metal oxide, a metal salt, phosphorus pentoxide ($P_2O_5$), or a mixture thereof, which may be used alone or in combination. The physical absorbent may include silica, zeolite, titania, zirconia, or montmorillonite.

As such, specific types of the metal oxide may include phosphorus pentoxide ($P_2O_5$), lithium oxide ($Li_2O$), sodium oxide ($Na_2O$), barium oxide (BaO), calcium oxide (CaO), or magnesium oxide (MgO), and examples of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$), or magnesium perchlorate ($Mg(ClO_4)_2$), but the present application is not limited thereto.

In the present application, the moisture absorbent such as a metal oxide may be mixed with the composition in a state in which the moisture absorbent is properly processed. For example, the encapsulation layer may be a thin film having a thickness of 30 μm or less according to the type of the organic electronic device to which the encapsulation film is to be applied. In this case, the moisture absorbent should be subjected to a grinding process. The grinding of the moisture absorbent may be performed using a 3-roll mill, bead mill, or ball mill process. Also, when the encapsulation film according to one exemplary embodiment of the present application is used in a top emission-type organic electronic device, the penetration rate of the encapsulation layer itself becomes important, and thus the size of moisture absorbent should be controlled to the minimum extent. Therefore, a grinding process may also be required for such applications.

The encapsulation composition according to one exemplary embodiment of the present application may include the moisture absorbent at a content of 1 part by weight to 100 parts by weight, preferably 5 parts by weight to 50 parts by weight, with respect to 100 parts by weight of the first and second resins. By controlling the content of the moisture absorbent is controlled such that the moisture absorbent is present at a content of 5 parts by weight or more, the encapsulation layer formed from the encapsulation composition may exhibit excellent moisture and humidity barrier properties. Also, by controlling the content of the moisture absorbent such that the moisture absorbent is present at a content of 50 parts by weight or less, the encapsulation layer may exhibit excellent moisture barrier properties while forming a thin-film encapsulation structure.

Unless particularly defined otherwise in this specification, the unit "part(s) by weight" may refer to a weight ratio between the respective components.

The encapsulation composition may further include a UV absorbent. The UV absorbent may be used to form an encapsulation layer in which a gradient in modulus of elasticity is formed in a transverse direction.

The encapsulation composition may further include a silane coupling agent. The silane coupling agent serves to enhance adhesiveness and adhesive stability of the encapsulation composition, thereby improving heat resistance and moisture resistance, and also serves to improve adhesive reliability even when kept under severe conditions for a long period of time. Examples of the silane coupling agent that may be used herein may, for example, include γ-glycidoxypropyl triethoxy silane, γ-glycidoxypropyl trimethoxy silane, γ-glycidoxypropyl methyldiethoxy silane, γ-glycidoxypropyl triethoxy silane, 3-mercaptopropyl trimethoxy silane, vinyltrimethoxysilane, vinyltriethoxy silane, γ-methacryloxypropyl trimethoxy silane, γ-methacryloxy propyl triethoxy silane, γ-aminopropyl trimethoxy silane, γ-aminopropyl triethoxy silane, 3-isocyanato propyl triethoxy silane, γ-acetoacetate propyl trimethoxysilane, γ-acetoacetate propyl triethoxy silane, β-cyanoacetyl trimethoxy silane, β-cyanoacetyl triethoxy silane, and acetoxyaceto trimethoxy silane, which may be used alone or in combination. It is desirable to use the silane-based coupling agent containing an acetoacetate group or a β-cyanoacetyl group, but the present application is not limited thereto. The pressure-sensitive adhesive composition may include the silane coupling agent at a content of 0.01 parts by weight to 5 parts by weight, or 0.01 parts by weight to 1 part by weight, with respect to 100 parts by weight of the polymer.

The encapsulation composition may further include at least one additive selected from the group consisting of an epoxy resin, a curing agent, a UV stabilizer, an antioxidant, a toning agent, a reinforcing agent, a filler, an antifoaming agent, a surfactant, a polyisobutylene oligomer, and a plasticizer, when necessary.

Also, the present application is directed to providing an encapsulation film formed from the above-described encapsulation composition.

The thickness of the encapsulation layer may be controlled in consideration of the number of layers included in each film, or use of the films. For example, when the film includes one encapsulation layer, the thickness of the encapsulation layer may be in a range of approximately 5 to 100 μm. Within this thickness range, a film having excellent moisture barrier properties, workability and durability may be provided.

The structure of the encapsulation film according to one exemplary embodiment of the present application is not particularly limited as long as the encapsulation film includes the encapsulation layer. By way of example, the encapsulation film may have a structure including a base film or release film (hereinafter also referred to as a "first film"); and an encapsulation layer formed on the base film or release film.

Also, the encapsulation film according to one exemplary embodiment of the present application may further include a base film or release film formed on the encapsulation layer (hereinafter referred to as a "second film").

FIGS. 1 to 3 are diagrams showing encapsulation films according to one exemplary embodiment of the present application.

As shown in FIGS. 1 and 2, the encapsulation film according to one exemplary embodiment of the present application may include an encapsulation layer 12 formed on a first film 11. The encapsulation layer 12 and the first film 11 according to one exemplary embodiment of the present application are shown in FIG. 1.

According to another exemplary embodiment of the present application, the encapsulation film according to one exemplary embodiment of the present application may further include a second film 13 formed on the encapsulation layer 12, as shown in FIG. 2. However, the encapsulation film shown in the drawing is merely one exemplary embodiment of the present application.

Specific types of the first film that may be used herein are not particularly limited. In the present application, conventional polymer films known in the related art may, for example, be used as the first film. In the present application, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film, or a polyimide film may, for example, be used as the base or release film. Also, one or both surfaces of the base film or release film according to one exemplary embodiment of the present application may be subjected to proper release treatment. Examples of a release agent used to release the base film may include an alkyd-based, silicone-based, fluoride-based, unsaturated ester-based, polyolefin-based, or wax-based release agent. Among these, it is desirable to use an alkyd-based, silicone-based or fluoride-based release agent in an aspect of heat resistance, but the present application is not limited thereto.

Also, types of the second film (hereinafter also referred to as a "cover film") that may be used herein are not particularly limited. For example, in the present application, types of films which are the same as or different from the first film in the category exemplified for the above-described first film may be used as the second film. In the present application, the second film may also be subjected to proper release treatment, and used.

In the present application, the thickness of such a base film or release film (i.e., a first film) is not particularly limited, and may be properly chosen according to the use of the first film to be applied. For example, in the present application, the thickness of the first film may be in a range of approximately 10 μm to 500 μm, preferably approximately 20 μm to 200 μm. When the thickness of the first film is less than 10 μm, the base film may be easily deformed during a manufacturing process, whereas economic feasibility may be lowered when the thickness of the first film is greater than 500 μm.

Also, in the present application, the thickness of the second film is not particularly limited. In the present application, for example, the second film may also be set to have the same thickness as the first film. Also, in the present application, the second film may be set to have a relatively smaller thickness than the first film in consideration of processability, and the like.

The thickness of the encapsulation layer included in the encapsulation film according to one exemplary embodiment of the present application is not particularly limited, and may be properly chosen according to the following requirements in consideration of the use of the film to be applied.

In the present application, a method of manufacturing such an encapsulation film is not particularly limited. For example, the encapsulation film may be manufactured using a method including coating the base film or release film with a coating solution including the above-described encapsulation composition (Operation 1), and drying the coating solution coated in Operation 1 (Operation 2).

Also, a method of stacking the respective encapsulation layers is not particularly limited. For example, an encapsulation film having a multilayer structure may be manufactured by laminating encapsulation layers formed on a separate release film.

In the method of manufacturing an encapsulation film according to one exemplary embodiment of the present application, Operation 3 of further pressing the base film or release film on the coating solution dried in Operation 2 may be further performed.

Operation 1 of the present application is an operation of preparing a coating solution by dissolving or dispersing the above-described encapsulation composition in a suitable solvent. In this process, the content of the resin and the like included in the coating solution may be properly controlled according to desired moisture barrier properties and film moldability.

In the present application, types of the solvent used to prepare the coating solution are not particularly limited. However, when a volatilization time of the solvent is very long, or the solvent is volatilized at a high temperature, problems regarding workability or durability of the encapsulation film may be caused. Thus, it is desirable to use a solvent having a volatilization temperature of 150° C. or less. In the present application, a small amount of the solvent having a volatilization temperature greater than this volatilization temperature range may also be mixed and used in consideration of film moldability, and the like. Types of the solvent that may be used herein may include methylethylketone (MEK), acetone, toluene, dimethylformamide (DMF), methylcellosolve (MCS), tetrahydrofuran (THF), xylene, or N-methylpyrrolidone (NMP), which may be used alone or in combination, but the present application is not limited thereto.

In Operation 1 of the present application, a method of coating the base film or release film with such a coating solution is not particularly limited. For example, a known method such as knife coating, roll coating, spray coating, gravure coating, curtain coating, comma coating, or lip coating may be used without limitation.

Operation 2 of the present application is an operation of forming an encapsulation layer by drying the coating solution coated in Operation 1. That is, in Operation 2 of the present application, the encapsulation layer may be formed by heating the coating solution coated on the film to dry the film and remove the solvent. In this case, the drying conditions are not particularly limited. For example, the drying may be performed at a temperature of 70° C. to 200° C. for 1 to 10 minutes. The drying conditions may be altered in consideration of the types of the solvent to be used.

In the method of manufacturing an encapsulation film according to one exemplary embodiment of the present application, Operation 3 of pressing another base film or release film on the encapsulation layer formed on the film may also be further performed after Operation 2.

Further, the present application is directed to providing an encapsulation product for organic electronic devices. According to one exemplary embodiment, the encapsulation product for organic electronic devices may include a substrate; an organic electronic device formed on the substrate; and the above-described encapsulation film configured to encapsulate the entire surface of the organic electronic device. Also, the encapsulation product may further include a cover substrate disposed on the encapsulation film.

In the present application, the organic electronic device may be an OLED.

The encapsulation product for organic electronic devices may further include a protective film configured to protect the organic electronic device between the encapsulation film and the organic electronic device.

In the organic electronic device, the encapsulation film may be used as an encapsulation layer configured to effectively fix and support the substrate and the cover substrate while exhibiting excellent moisture barrier properties and optical properties.

As described above, the encapsulation film may also exhibit excellent transparency, thereby realizing a stable encapsulation structure regardless of the shape of the top emission-type organic electronic device as well as a bottom emission-type organic electronic device.

In this specification, the term "encapsulation film" may refer to a pressure-sensitive adhesive layer or an adhesive layer configured to cover all the top surface and lateral surfaces of the organic electronic device.

Still another aspect of the present application provides a 의 method of manufacturing an organic electronic device, which includes applying the above-described encapsulation layer of the encapsulation film to a substrate having the organic electronic device formed on a surface thereof to cover the organic electronic device. The manufacturing method is also related to a method of manufacturing an organic electronic device, which include curing the encapsulation layer.

In this specification, the term "curing" may mean that the encapsulation composition according to one exemplary embodiment of the present application is prepared in the form of a film by subjecting the encapsulation composition to a heating or UV irradiation process to form a cross-linked structure.

Applying the encapsulation film to the organic electronic device may be performed using a hot-roll laminating, hot pressing, or vacuum pressing method, but the present application is not particularly limited thereto.

The applying of the encapsulation film to the organic electronic device may be performed at a temperature of 50° C. to 90° C., and the curing may be performed by heating at a temperature of 70° C. to 110° C. or irradiation with UV rays.

Also, the method of the present application may further include attaching the encapsulation layer of the encapsulation film to another encapsulation material such as a glass or a metal so that the encapsulation layer comes in contact with the encapsulation material.

FIG. 3 is a cross-sectional view showing an encapsulation product for organic electronic devices according to one exemplary embodiment of the present application.

In the method of manufacturing an organic electronic device according to one exemplary embodiment of the present application, for example, a transparent electrode or a reflective electrode is formed on a substrate 21 such as a glass or a polymer film using a method such as vacuum deposition or sputtering, and an organic material layer is formed on the transparent electrode or the reflective electrode. The organic material layer may include a hole injection layer, a hole transport layer, an emissive layer, an electron injection layer and/or an electron transport layer. Next, a second electrode is further formed on the organic material layer. Subsequently, the above-described encapsulation layer 12 is applied onto the organic electronic device 23 formed on the substrate 21 to cover the entire surface of the organic electronic device 23. In this case, a method of applying the encapsulation layer 12 is not particularly limited. For example, a cover substrate 22 (for example, a glass or a polymer film), which is prepared by previously transferring the encapsulation layer of the encapsulation film according to one exemplary embodiment of the present application to a top surface of the organic electronic device 23 formed on the substrate 21, may be applied using methods such as heating, pressing, and the like. In this operation, for example, when the encapsulation layer 12 is transferred to the top surface of the cover substrate 22, the base film or release film formed on the film may be peeled using the above-described encapsulation film according to one exemplary embodiment of the present application, and the encapsulation layer 12 may be transferred to the top surface of the cover substrate 22 while applying heat using a vacuum press or a vacuum laminator. In this procedure, when a curing reaction of the encapsulation film is performed beyond a certain extent, cohesiveness and adhesiveness of the encapsulation layer 12 may be degraded. Accordingly, it is desirable to control a process temperature at approximately 100° C. or less and a processing time within 5 minutes. Similarly, even when the cover substrate 22 to which the encapsulation layer 12 is transferred is heated and pressed against the organic electronic device, a vacuum press or a vacuum laminator may be used. In this procedure, the temperature conditions may be set as described above, and the processing time may be within 10 minutes.

In the present application, another cross-linking or curing process may also be performed on the encapsulation film against which the organic electronic device is pressed. Here, this cross-linking or curing process (the present curing) may, for example, be performed in a heating chamber, or a UV chamber. The conditions used in this cross-linking or curing process may be properly chosen in consideration of stability of the organic electronic device.

However, the above-described manufacturing process is merely one example for encapsulating the organic electronic device according to one exemplary embodiment of the present application, and the processing order, and the processing conditions may be changed readily. In the present application, for example, the order of the transfer and pressing processes may be changed by first transferring the encapsulation layer 12 according to one exemplary embodiment of the present application to the organic electronic device 23 formed on the substrate 21, and then pressing the cover substrate 22. Also, when a passivation layer is formed on the organic electronic device 23, the encapsulation layer 12 may be applied to the passivation layer, and cured without forming the cover substrate 22.

Effects

The encapsulation composition according to one exemplary embodiment of the present application can be useful in effectively preventing moisture or oxygen from flowing into the organic electronic device from external environments while realizing transparency when the encapsulation composition is formed in the form of a film to encapsulate the organic electronic device. Also, the encapsulation film formed of the encapsulation composition according to one exemplary embodiment of the present application can be useful in ensuring mechanical properties such as handling properties and processability, and the organic electronic device whose encapsulation structure is formed by means of the encapsulation film may have improved lifespan and

DETAILED DESCRIPTION OF EXEMPLARY EMBODIMENTS

Figure 1:
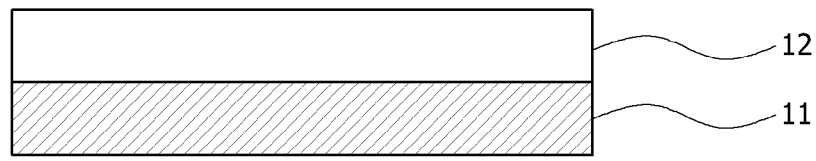
FIGS. 1 and 2 are cross-sectional views showing encapsulation films according to one exemplary embodiment of the present application.
Figure 2:
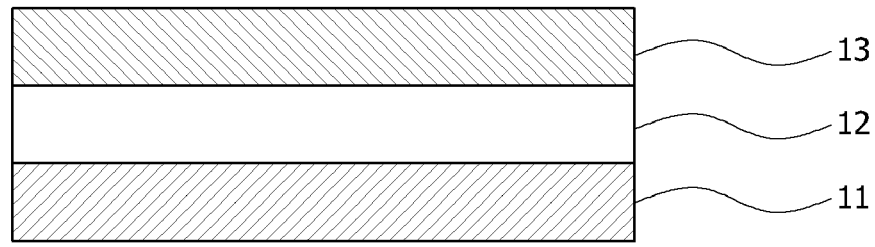
Figure 3:
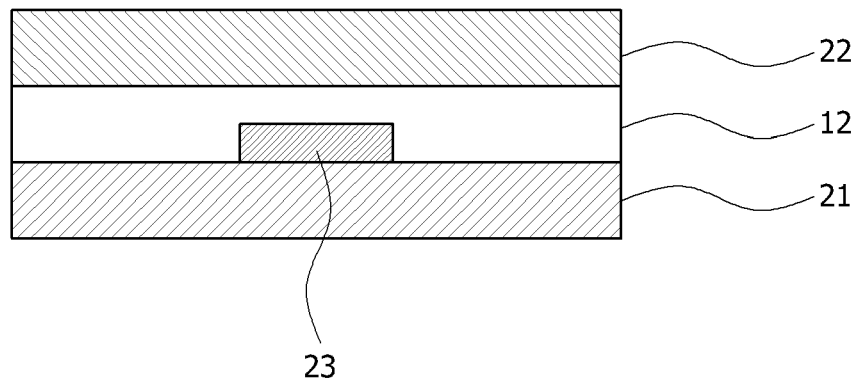
FIG. 3 is a cross-sectional an encapsulation product for organic electronic devices according to one exemplary embodiment of the present application.

Hereinafter, the present invention will be described in further detail with reference to Examples according to the present invention and Comparative Examples not according to the present invention, but it should be understood that the Examples and Comparative Examples described below are not intended to limit the scope of the present invention.

Preparative Example 1: Polymerization of Second Resin (Alkyl(Meth)Acrylate Copolymer)

A monomer mixture including 95 parts by weight of cyclohexyl methacrylate and 5 parts by weight of 2-hydroxyethyl acrylate was put into a 4-L reactor equipped with a cooling system to facilitate the reflux of nitrogen gas and the control of temperature, and 100 parts by weight of ethyl acetate was added as a solvent to the reactor. Thereafter, the reactor was purged with nitrogen gas for 60 minutes to remove oxygen, and kept at a temperature of 60° C. The resulting mixture was homogenated, and 0.04 parts by weight of azobisisobutyronitrile was added as a reaction initiator, reacted for 7 hours, and then diluted with ethyl acetate to obtain a polymer. Then, a copolymer having a weight average molecular weight of 850,000 and a molecular weight distribution of 2.31 was obtained by means of the polymerization reaction.

Example 1

A polyisobutylene resin (Mw=500,000) and the acrylic copolymer prepared in Preparative Example 1 were mixed at a ratio of 90:10 as the first and second resins, respectively. Thereafter, a hydrogenated DCPD-based tackifier resin was mixed at a content of 20 parts by weight, with respect to the total weight of the first and second resins. 0.1 parts by weight (with respect to the total weight of the resin) of a tolylene diisocyanate addut (TDI) of isocyanate-based trimethylolpropane as a multifunctional cross-linking agent was added thereto, and the resulting mixture was diluted to a solid content of 20%, and homogeneously mixed. Subsequently, a release paper was coated with the mixture, and dried for 10 minutes in a 110° C. oven so that the coating had a thickness of 50 μm after drying.

Example 2

An encapsulation composition was prepared in the same manner as in Example 1, except that the ratio of that the first resin and the second resin used in Example 1 was changed to 80:20.

Example 3

An encapsulation composition was prepared in the same manner as in Example 1, except that the ratio of that the first resin and the second resin used in Example 1 was changed to 70:30.

Example 4

An encapsulation composition was prepared in the same manner as in Example 1, except that isobornyl acrylate was used instead of the cyclohexyl methacrylate in preparation of the second resin (the reaction temperature and method were the same for the second resin, and the encapsulation composition having a weight average molecular weight of 700,000 and a molecular weight distribution of 2.1).

Example 5

An encapsulation composition was prepared in the same manner as in Example 1, except that methyl methacrylate was used instead of the cyclohexyl methacrylate in preparation of the second resin in Example (the reaction temperature and method were the same for the second resin, and the encapsulation composition having a weight average molecular weight of 840,000 and a molecular weight distribution of 3.9).

Example 6

An encapsulation composition was prepared in the same manner as in Example 1, except that the ratio of that the first resin and the second resin used in Example 1 was changed to 30:70.

Comparative Example 1

An encapsulation composition was prepared in the same manner as in Example 1, except that 100 parts by weight of the first resin was added without addition of the second resin used in Example 1, and a tackifier resin (a hydrogenated DCPD-based resin) was mixed at a content of 20 parts by weight, with respect to the total weight of the first resin.

Comparative Example 2

An encapsulation composition was prepared in the same manner as in Example 1, except that a cyclohexyl methacrylate homopolymer was used instead of the second resin used in Example 1 without addition of the cross-linking agent (the reaction temperature and method were the same for the second resin, and the encapsulation composition having a weight average molecular weight of 800,000 and a molecular weight distribution of 2.5).

Experimental Example 1: Evaluation of Transmittance

The encapsulation compositions prepared in Examples 1 to 6 and Comparative Examples 1 and 2 were prepared into encapsulation films so that the encapsulation layers had a thickness of approximately 50 μm. The encapsulation layers of the prepared encapsulation films were transferred to a glass without formation of bubbles. Thereafter, the glass serving as the standard substrate was measured for light transmittance at a wavelength range of 380 nm to 780 nm using a UV/Vis spectrophotometer.

Experimental Example 2: Evaluation of Moisture Barrier Properties

The encapsulation compositions prepared in Examples 1 to 6 and Comparative Examples 1 and 2 were prepared into encapsulation films so that the encapsulation layers had a thickness of approximately 100 μm. Thereafter, the encapsulation layers were laminated with porous films, and base films were peeled to prepare test samples. Then, the test samples were measured for WVTR in a transverse direction in a state in which the test samples were positioned at 100° F. and 100% relative humidity. The WVTR was measured according to the ASTM F1249 standard.

Experimental Example 3: Evaluation of Cuttability

The encapsulation compositions prepared in Examples 1 to 6 and Comparative Examples 1 and 2 were prepared into encapsulation films so that the encapsulation layers had a thickness of approximately 50 μm and had a structure in which the bases films were present both surfaces of each of the encapsulation layers. The prepared encapsulation films were cut at a size of 100 mm×100 mm to prepare test samples. When relatively thin base films are peeled at a high speed to evaluate cuttability (○: excellent; Δ: mean, and x: poor) of the encapsulation films, the cuttability is evaluated to be excellent when the encapsulation film is stably attached to a base film, mean when the encapsulation film is stably attached to a base film but delamination occurs at an end portion of the encapsulation film, and poor when the encapsulation film is generally delaminated from the thin base film due to exudation of the composition.

TABLE 1

| Item | Moisture barrier properties, WVTR, (g/m² day) | Transmittance (%) | Cuttability |
|---|---|---|---|
| Example 1 | 3.2 | 94 | ○ |
| Example 2 | 4.5 | 91 | ○ |
| Example 3 | 7.8 | 91 | ○ |
| Example 4 | 5.6 | 93 | ○ |
| Example 5 | 10.7 | 80 | ○ |
| Example 6 | 20.8 | 85 | ○ |
| Comparative Example 1 | 3.0 | 94 | X |
| Comparative Example 2 | 45.9 | 90 | Δ |

In the case of Comparative Example 1 in which the polyisobutylene resin was introduced as the first resin without a separate cross-linked structure, it could be seen that the encapsulation composition has excellent moisture barrier properties, but exhibited very poor cuttability. In the case of Comparative Example 2 in which no separate cross-linked structure was formed in the second resin, it could also be seen that the encapsulation composition exhibited poor cuttability and had has very poor moisture barrier properties.

DESCRIPTION OF REFERENCE NUMERALS

11: base film or release film
12: encapsulation layer
13: cover film
21: substrate
22: cover substrate
23: organic electronic device

What is claimed is:
1. An encapsulation composition comprising:
a first resin having a weight average molecular weight of 100,000 to 2,000,000;
a second resin, which is a polymer of a mixture comprising an alkyl (meth)acrylate and a monomer having at least one reactive functional group; and
at least one multifunctional cross-linking agent selected from the group consisting of an isocyanate cross-linking agent, an epoxy cross-linking agent, an aziridine cross-linking agent, and a metal chelate cross-linking agent,
wherein the first resin comprises a polyisobutylene resin,
wherein the second resin has a cross-linked structure and forms a semi-interpenetrating polymer network with the first resin,
wherein, in the second resin, the monomer having at least one reactive functional group is included in an amount of 5 to 50 parts by weight with respect to 100 parts by weight of the alkyl (meth)acrylate, and
wherein the monomer having the reactive functional group comprises a hydroxyl group-containing monomer or a carboxyl group-containing monomer.
2. The encapsulation composition of claim 1, wherein the first resin has a contact angle of 80° or more with deionized water.
3. The encapsulation composition of claim 1, wherein the first resin has a glass transition temperature of 0° C. or less.
4. The encapsulation composition of claim 1, wherein the second resin is included at a content of 1 to 50 parts by weight, with respect to 100 parts by weight of the first resin.
5. The encapsulation composition of claim 1, wherein a difference in solubility parameter between the first resin and the second resin is 1 $(cal/cm^3)^{1/2}$ or less.
6. The encapsulation composition of claim 1, wherein the alkyl (meth)acrylate satisfies the following Formula 1:

[Formula 1]

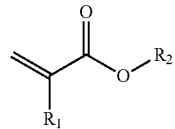

wherein $R_1$ represents hydrogen, or an alkyl group having 1 to 4 carbon atoms, and $R_2$ represents a linear, branched or cyclic alkyl group having 3 to 30 carbon atoms.
7. The encapsulation composition of claim 1, which has a light transmittance of 80% or more with respect to a visible ray region having a wavelength of 380 nm to 780 nm, as measured by a spectrophotometer when prepared in the form of a film.
8. The encapsulation composition of claim 1, further comprising a moisture absorbent.
9. An encapsulation film comprising an encapsulation layer formed from the encapsulation composition of claim 1.
10. An encapsulation product for organic electronic devices comprising:
a substrate;
an organic electronic device formed on the substrate; and
the encapsulation film of claim 9 configured to encapsulate the organic electronic device.

11. A method of manufacturing an organic electronic device, comprising:
 applying the encapsulation layer of the encapsulation film of claim 9 to a substrate having an organic electronic device formed on a surface thereof to cover the organic electronic device.

\* \* \* \* \*